AMPLIFIER VOLUME CONTROL ATTENUATOR

Filed Oct. 7, 1952

INVENTOR.
ROBERT CRANE, JR.
WILLIAM H. SWAIN
BY
H. S. Mackey
ATTORNEY.

Patented July 30, 1957

2,801,300

AMPLIFIER VOLUME CONTROL ATTENUATOR

Robert Crane, Jr., Chappaqua, and William H. Swain, Pleasantville, N. Y., assignors to General Precision Laboratory Incorporated, a corporation of New York Application October 7, 1952, Serial No. 313,524

4 Claims. (Cl. 179—171)

This invention relates to attenuators of the voltage divider type wherein the electron path of a thermionic tube constitutes part of the voltage divider circuit, and more especially to attenuators suitable for application in automatic amplifier gain control circuits.

In the control of amplifier gain with avoidance of distortion it is necessary to employ selected bias values for the several amplifier tubes to permit them to operate linearly. One method of gain control for employment with such fixed bias values applies an attenuator at the output of one or more amplifier stages. Another method uses adjustable negative feedback. Still another method combines the attenuator of the first method with the feedback of the second method. It is this method of gain control that is employed in one embodiment of this invention.

In an attenuator of the voltage divider type one or more electronic tubes can be used as adjustable resistances, their resistances being adjusted by controlling the grid voltages. These grid voltages can be manually applied, can be derived from other equipment, or can be derived from the input or output signal of the amplifier itself. In the last case the control becomes automatic and the use of tubes is essential. Control can be made very nearly flat, so that the amplifier produces a nearly constant level output signal over a large range of input signal level, while the signal experiences substantially no quality deterioration caused by the gain control. Such an attenuator is unique in combining ease of electrical control with negligible deterioration of quality.

Obviously it is possible to combine manual and automatic gain control so that the amplifier will maintain a selected constant output level regardless of input signal level, the selection of the output level being manually accomplished.

In accordance with well-known principles of the art, the instant gain control of the automatic type can also be designed for use as a volume compressor, or as a volume expander, merely by changing the values of components employed.

The principal object then of this invention is to provide an amplifier having a voltage divider gain control, the voltage divider incorporating a discharge tube.

Another object of this invention is to provide an amplifier having negative feedback adjustable by means of a voltage divider incorporating a discharge tube.

Still another object of this invention is to provide an amplifier containing automatic and/or manual gain control comprising negative feedback adjustable by means of a voltage divider incorporating a discharge tube.

Still another object of this invention is to provide an attenuator, including a discharge tube, in the form of a resistance network arranged as a voltage divider, the attenuator having a wide range of attenuation.

Figure 1:
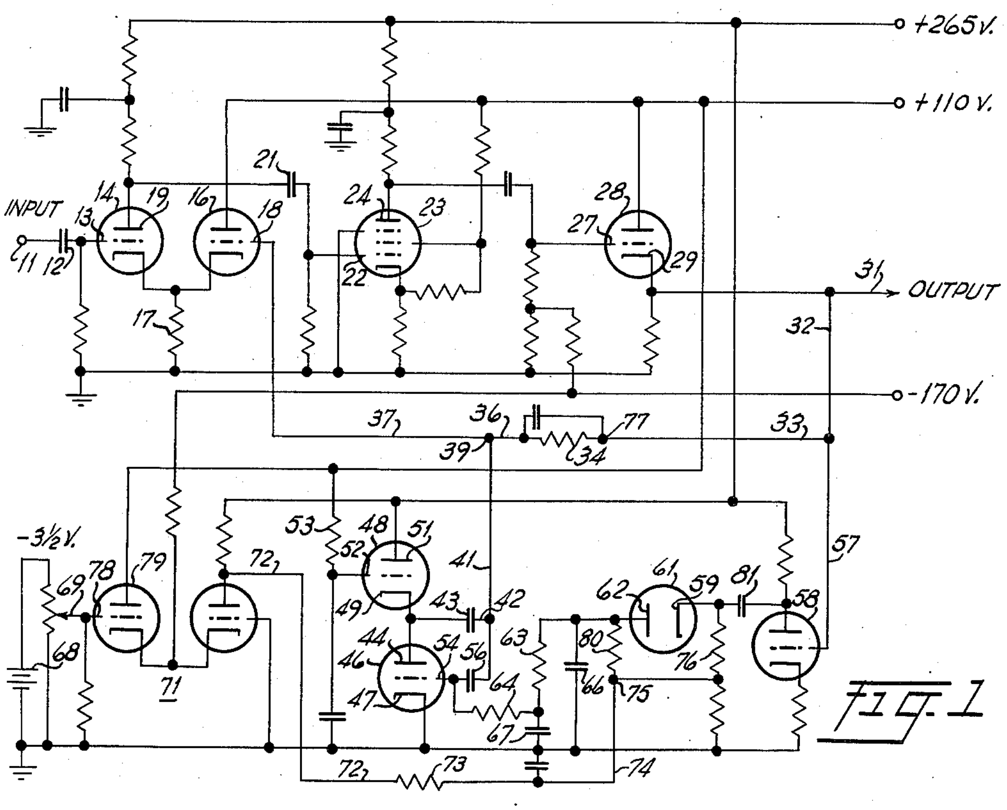

A further understanding of this invention may be secured from the detailed description and the accompanying drawings, in which:

Figure 1 is a schematic diagram of the invention as applied to amplifier circuits.

Figure 2:
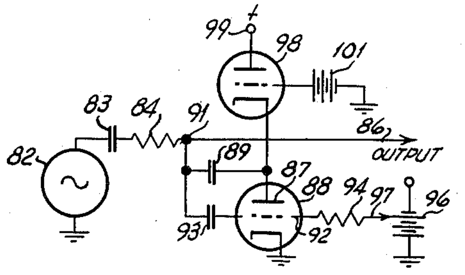
Figure 3:
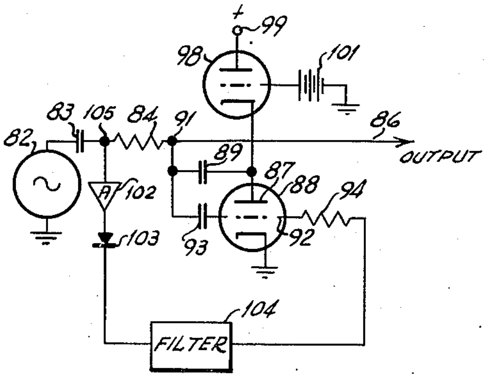

Figures 2 and 3 schematically illustrate the general application of the attenuator of the invention.

Figure 4:
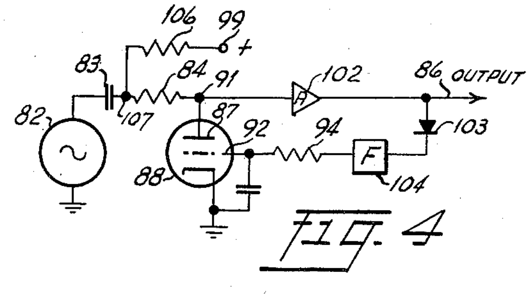

Figure 4 schematically illustrates a modified form of the attenuator of the invention.

Referring now to Fig. 1, the input terminal 11 is coupled through condenser 12 to the input grid 13 of a first amplifier stage comprising tubes 14 and 16 cathode-coupled by resistor 17, the control grid 18 of tube 16 being used to introduce negative feedback. The output of this stage is taken from plate 19 through coupling condenser 21 to the control grid 22 of the second stage, which comprises a pentode 23. The second stage output is taken from plate 24 through coupling condenser 26 to the grid 27 of a third stage. This stage comprises a cathode follower triode 28, the output of which is taken from cathode 29 through conductor 31.

A feedback circuit is provided between the output and input consisting of the conductor 32 connected to the output conductor 31, conductor 33, resistor 34, conductors 36 and 37, the latter being connected to the control grid 18 of the first-stage tube 16. The polarity of feedback is made such as to cause it to be degenerative, as is conventional in linear amplifiers. The resistor 34 is preferably bypassed by a small condenser 38 to equalize phase at the higher frequencies.

This feedback circuit is additionally provided with a shunt path to ground extending from junction 39 through conductors 41 and 42, blocking condenser 43, plate 44 of triode 46, and through the triode to its grounded cathode 47. The condenser 43, while blocking direct current, is large enough to offer negligible impedance to alternating currents above 100 C. P. S., and therefore permits an appropriate direct-current plate voltage to be applied to plate 44 without interfering with the operation of the signal amplifier. This direct-current voltage is applied to plate 44 through a triode 48, the cathode 49 of which is connected to plate 44 while the plate 51 thereof is connected to a source of positive voltage. The plate-cathode space of the triode 48 therefore is interposed between the positive source and the tube 46 and serves as the plate resistor therefor. The control grid 52 of tube 48 is connected through a fixed resistor 53 to a fixed source of positive voltage represented by the +110 v. terminal.

The junction 39 is also connected to the control grid 54 of tube 46 through a condenser 56 for reasons that will appear.

The triode 46 has applied thereto two direct-current control potentials. The first is a manually controlled potential which determines the level or amount of amplification of the amplifier and the second is a feedback potential automatically derived from the output of the amplifier.

The manual amplifier level control is accomplished by the potential source 68 shunted by a voltage divider 69 which adjusts the potential of the control grid 78 of a direct coupled amplifier 71, the potential so applied being adjustable over a range of from 0 to −3½ volts. The direct-current output voltage derived from the amplifier 71 is applied to the grid 54 of the tube 46 over a path consisting of conductor 72, resistor 73, conductor 74 and resistors 80, 63 and 64, the potential so applied varying over a range of from +17 to +3 volts at conductor 74 depending on the manual adjustment of the potentiometer 69.

The automatic control derived from the output of the amplifier is applied to the control grid 54 of the tube 46 over a path consisting of conductors 32 and 57, triode amplifier 58 and rectifier 61, which rectifies the amplified alternating current output of the main amplifier producing a unidirectional potential drop across resistor 80. This potential drop is in turn filtered by the network consisting of resistors 63 and 64 and the condensers 66 and 67 before impressed on the grid 54.

It will be noted that this rectified potential as it appears across resistor 80 is in opposition to the potential derived from the direct-coupled amplifier 71 and that it is the resultant difference of these potentials which constitutes the actual bias for the tube 46. A reduction of the negative potential impressed on the direct-coupled amplifier 71 of course, results in a reduction of the positive potential derived from the amplifier 71 and applied in opposition to the negative potential produced across the resistor 80 by the amplified and rectified main amplifier output resulting in a net increase in the negative bias applied to the grid 54. Of course, such a change in adjustment results in a lower output being produced by the main amplifier so that the potential attributable to the action of the rectifier 61 and its associated circuits is also reduced. This reduction, however, is a lesser amount than that occasioned at the output of the direct-coupled amplifier 71 so that the net result is an increase in the negative bias applied to tube 46.

In operation, the gain of the signal amplifier path depends upon the amount of degenerative feedback applied to its first stage, which in turn depends upon the values of the attenuator therein comprising the shunted resistor 34 as its series arm and the internal resistance of the triode 46 in parallel with that of triode 48 as its shunt arm. This attenuator is adjustable through wide limits because the resistance of its shunt arm can be varied, and the attenuation can be expressed in terms of the ratio of the voltage $E_o$ derived from junction 39 to the voltage $E_i$ applied to the resistor at terminal 77 as follows:

$$\frac{E_o}{E_i}=\frac{R_s}{R_r+R_s} \quad (1)$$

in which $R_s$ is the resistance of the shunt arm and $R_R$ is the resistance of resistor 34.

The resistance $R_s$ of the shunt arm consists basically of the effective internal or plate resistance of the triode 46 in parallel with the internal or cathode resistance of triode 48. Considering first tube 46 alone, its internal resistance is widely variable by manual adjustment of the voltage divider 69 which together with the potential derived from the main amplifier acts to determine the bias of the tube 46 as previously described. Variations of as much as 40 db in input signal intensity applied to terminal 11 have been completely neutralized and eliminated by such a circuit arrangement. This wide range of control cannot be attained by variations in the actual internal resistance of a tube, no tube having a large enough ratio between the maximum and minimum plate resistance in the control range which avoids undue distortion. However, in this circuit the apparent tube resistance ratio is increased by the addition of the condenser 56. This addition increases this ratio by reducing the apparent minimum resistance to an extent depending on the transconductance of the tube, in the following manner. The alternating fed-back signal voltage applied through condenser 43 to plate 44 is also applied through condenser 56 to grid 54 so that in this circuit the signal voltage applied to the plate 44, $e_{in}$, may be said to equal the signal voltage applied to the grid 54, $e_g$. The apparent resistance presented by tube 46 to the junction 39, $R_{in}$, equals the input signal voltage divided by plate current, or $$R_{in}=\frac{e_{in}}{i} \quad (2)$$

But since $$e_{in}=e_g \quad (3)$$

$$R_{in}=\frac{e_g}{i} \quad (4)$$

However, as $$i=g_m e_g \quad (5)$$

in which $g_m$ is the tube transconductance, $$R_{in}=\frac{1}{g_m} \quad (6)$$

That is, the effective input resistance at junction 39 is equal to the reciprocal of the transconductance. This reciprocal term is far less than the plate resistance, $R_p$, being by definition the plate resistance divided by the amplification factor. Thus by making the transconductance of tube 46 high, the effective tube resistance as part of the shunt element of the attenuator can be made very low.

The Equation 6 also holds true for the maximum value of tube resistance, but in this case the transconductance approaches zero value, which it attains at tube cut-off. Therefore, the addition of the condenser 56 does not reduce the maximum attainable value of tube resistance, which is very high.

The use of the triode 48 to serve as the plate supply resistor for tube 46 further reduces the minimum resistance of the shunt branch of the voltage divider. This occurs because the tube 48 behaves as a variable resistance having a magnitude dependent upon its grid-cathode bias. The grid 52 is connected to a constant voltage source, so that when the plate resistance of tube 46 is low, the cathode 49 of tube 48 is brought relatively near to ground potential, greatly increasing its positive grid-cathode bias and reducing its plate resistance to a low value. In addition the effective internal resistance of tube 48 as presented through conductor 42 to junction 39 is the reciprocal of its transconductance, for reasons similar to those described in the case of tube 46.

These variations in the effective internal resistance of tube 48 act to halve the minimum resistance of the shunt branch of the attenuator because, for alternating current the effective internal resistance of tube 48 is in shunt with the effective internal resistance of tube 46. This may be seen by noting that the tube 46 is connected between junction 39 and ground, and the tube 48 is connected between junction 39 and the source of high positive voltage. But since this source is normally of low resistance and is conventionally shunted by very large condensers it has substantially zero impedance to ground for alternating current, and in this circuit must have low impedance to secure sufficient decoupling of the several components utilizing the source. Therefore the plate 51 and cathode 47 are at the same voltage level insofar as alternating voltage applied to junction 39 is concerned and the tubes 46 and 48 behave as if in parallel as respects the alternating voltage existing at junction 39.

The resistance to ground presented by this circuit to the junction 39 has been found to have a minimum value not greater than 300 ohms, while a maximum value of at least 40,000 ohms is obtainable, the complete range being secured by control of the direct voltage applied to the grid 54.

The frequency band which this amplifier passes with equal amplification of all frequencies has the limits of 200 cycles and 50 kilocycles. At the same time, and for all frequencies within this wide band the amplifier employing this attenuator automatically controls variations of input signal amplitude that may amount to as much as 40 db.

The successful operation of this gain control depends upon the use of the described wide range voltage divider which in turn depends upon the widely variable shunt branch comprising the two tubes 46 and 48. Such a voltage divider can be utilized in a number of ways, one of which has been described, so that it has no deleterious effect on the amplifier quality. The output harmonic content of the amplifier can, therefore, be maintained under all conditions at a very low value, a result not attainable with other types of gain control circuits. This is because in this circuit distortion is reduced by feedback, which cannot be done in normal gain-controlled amplifiers, to which signal feedback cannot be applied.

It is obvious that such a voltage divider, loaded and controlled in this manner, can be used in locations other than that described and in connection with other devices. Such a voltage divider is not restricted to use in the feedback loop of an amplifier or in any part of an amplifier. In general, the voltage divider is suitable for employment in alternating current circuits as a wide range attenuator controlled by a direct voltage. In Fig. 2 an alternating current source is indicated at 82, the output thereof being coupled through condenser 83 to a series resistor 84 and therefrom to an output conductor 86. The plate 87 of a resistance tube 88 is connected through a blocking condenser 89 to the output terminal 91 of the resistor 84, and the grid 92 of the tube is coupled through a condenser 93 to the same point 91. The grid 92 is also connected through a protective resistor 94 to an adjustable source of constant potential represented by the battery 96 and adjustable tap 97. The plate supply for the plate 87 is secured through a second resistance tube 98 having a plate supply represented by terminal 99 and a fixed grid bias represented by the battery 101.

The operation of this circuit is similar to that of the voltage divider of Fig. 1, the resistor 84 constituting the series arm, and the apparent internal plate resistance of the tube 88, shunted by the apparent internal cathode resistance of the tube 98, constituting the shunt resistance arm. The generator 82 represents the signal amplifier of Fig. 1 and the grid control battery 96 represents any generalized grid control direct voltage. The junction 91 represents the junction 39 of Fig. 1 at which the attenuating effect is secured. All elements of this attenuator of Fig. 2 are thus represented in the attenuator of Fig. 1, the operation of which has been described.

Where automatic operation is desired the circuit of Fig. 3 may be used to advantage. This circuit is similar to that of Fig. 2 and like reference numerals have been used to refer to like components. In addition to the basic circuit disclosed in Fig. 2 the description of which need not be repeated, automatic control of the attenuation characteristics is obtained by the circuit consisting of amplifier 102, rectifier 103 and filter 104 connected in a series circuit extending between the terminal 105 of the resistor 84 and the grid 92 of the tube 88. Thus variations in amplitude of the alternating potential applied to the attenuator circuit are rectified, filtered and utilized to apply a bias to the tube 88 in such direction so as to vary the attenuator characteristics in a manner to compensate for alternating current input variations.

Elimination of the functions of the tube 48, and condenser 56, Fig. 1 or tube 98 and condenser 89, Figs. 2 and 3, results in a simpler circuit but having less range of control, illustrated in Fig. 4. In this circuit the alternating current generator 82 is coupled through a condenser 83 to a series voltage divider resistor 84 and an output conductor 86. A resistance tube 88 has its plate 87 connected to the output terminal 91 of the series resistor 84, the internal resistance of the tube 88 serving as the voltage divider shunt resistance. The plate voltage is secured from the voltage terminal 99 through a relatively high resistance 106 and the resistance 84 in series. The internal resistance of the tube 88 is controlled by the bias of its grid 92, which is automatically controlled by the output signal strength through an automatic gain control branch connected to the output conductor 86. The feedback amplifier 102 also amplifies the signal output, and the direct-current control signal is secured from its output through rectifier 103, filter 104 and resistor 94. The voltage divider is composed of the resistor 84 in series with the internal plate resistance of tube 88, and is shunted across the input signal between terminal 107 and ground.

The divided voltage is taken between terminal 91 and ground.

What is claimed is:

1. An attenuator comprising, a resistor, a first discharge tube having at least an anode, cathode and control grid, an alternating current circuit including a series condenser connecting said anode to one terminal of said resistor, means including a rectifier connected between the other terminal of said resistor and said control grid for automatically controlling the anode resistance within said first discharge tube, a second discharge tube having at least an anode, cathode and control grid, means for applying a fixed bias thereto, a direct-current connection between the cathode of said second discharge tube and the anode of said first discharge tube, means for applying a positive direct-current potential to the anode of said second discharge tube relative to the cathode of said first discharge tube, a condenser connected between the anode and control grid of said first discharge tube, whereby the apparent anode resistance of said first discharge tube presented to said one terminal of said resistor is equal to its anode resistance divided by its amplification factor, means for applying an alternating voltage to be attenuated between said other terminal of said resistor and the cathode of said first discharge tube, a utilization circuit connected between a terminal of said resistor and the cathode of said first discharge tube.

2. A gain control circuit comprising, a signal amplifier, a negative feedback circuit therefor including a resistor having one terminal connected to the output and the other terminal connected to the input of said amplifier, a discharge tube having at least an anode, cathode and control grid, a condenser interconnecting said anode and said other terminal of said resistor, a second condenser interconnecting said control grid and said other terminal of said resistor, a second discharge tube having its space current path interposed between the anode of said first mentioned discharge tube and a source of positive potential, means for applying a fixed potential to the grid of said second discharge tube, and means for applying a control potential to the control grid of said first mentioned discharge tube.

3. A gain control circuit comprising, a signal amplifier, a negative feedback circuit therefor including a resistor having one terminal connected to the output and the other terminal connected to the input of said amplifier, a discharge tube having at least an anode, cathode and control grid, a condenser interconnecting said anode and said other terminal of said resistor, a second condenser interconnecting said control grid and said other terminal of said resistor, a second discharge tube having its space current path interposed between the anode of said first mentioned discharge tube and a source of positive potential, means for applying a fixed potential to the grid of said second discharge tube, means including rectifying means producing a unidirectional potential proportional to the output of said amplifier, and means for impressing said unidirectional potential on the control grid of said first mentioned discharge tube.

4. A gain control circuit in accordance with claim 3 having means for additionally impressing a manually variable potential on the control grid of said first mentioned discharge tube.

References Cited in the file of this patent

UNITED STATES PATENTS

| | | |
|---|---|---|
| 2,247,468 | Barr et al. | July 1, 1941 |
| 2,263,683 | Rockwell | Nov. 25, 1941 |
| 2,326,614 | Bowman | Aug. 10, 1943 |
| 2,369,066 | Maxwell | Feb. 6, 1945 |
| 2,428,039 | Royden | Sept. 30, 1947 |
| 2,543,797 | Page | Mar. 6, 1951 |
| 2,585,854 | Scott | Feb. 12, 1952 |
| 2,631,197 | Vilkomerson et al. | Mar. 10, 1953 |